(12) United States Patent
Tseng (10) Patent No.: US 9,907,187 B1
(45) Date of Patent: Feb. 27, 2018

(54) PCB WITH TWO ROWS OF SOLDER PADS INCLUDING BOTH SMT-BASED AND DIP-BASED STRUCTURES

(71) Applicant: SIMULA TECHNOLOGY INC., Taoyuan (TW)

(72) Inventor: Te-Chih Tseng, Taoyuan (TW)

(73) Assignee: SIMULA TECHNOLOGY INC., Taoyuan, Taoyuan County (TW)

( * ) Notice: Subject to any disclaimer, the term of this patent is extended or adjusted under 35 U.S.C. 154(b) by 0 days.

(21) Appl. No.: 15/657,254

(22) Filed: Jul. 24, 2017

(30) Foreign Application Priority Data

Apr. 28, 2017 (TW) .............................. 106114269 A (51) Int. Cl.
*H01L 23/48* (2006.01)
*H05K 3/34* (2006.01)
*H05K 1/11* (2006.01)
*H01R 12/72* (2011.01)
*H01R 13/6473* (2011.01)

(52) U.S. Cl.
CPC ............ *H05K 3/341* (2013.01); *H01R 12/72* (2013.01); *H01R 13/6473* (2013.01); *H05K 1/111* (2013.01); *H05K 1/117* (2013.01); *H05K 2201/09409* (2013.01); *H05K 2201/09418* (2013.01); *H05K 2201/10325* (2013.01)

(58) Field of Classification Search
CPC . H01L 2224/48091; H01L 2924/01079; H01L 23/041

USPC .................................................. 257/692–697
See application file for complete search history.

(56) References Cited

U.S. PATENT DOCUMENTS

| 7,279,412 B2 * | 10/2007 | Mok ..................... H05K 3/462 29/829 |
| 9,583,425 B2 * | 2/2017 | Xu ..................... H01L 23/49811 |
| 2014/0349514 A1 * | 11/2014 | Yang .................. H01R 13/6581 439/487 |

* cited by examiner

*Primary Examiner* — Phuong Chi T Nguyen
(74) *Attorney, Agent, or Firm* — Bacon & Thomas, PLLC (57) ABSTRACT

A PCB with two rows of solder pads including both SMT-based and DIP-based structures is configured to be mounted with a USB Type-C connector by soldering, has two rows of solder pads on its top side, and is characterized in that at least one solder pad in one of the rows is a DIP-based structure while the remaining solder pads in the same row are SMT-based structures, and that all the solder pads in each row that are used to transmit high-frequency signals are SMT-based structures. Once the connector is mounted to the PCB, an inspector can directly examine the soldering quality of the DIP-based-structure solder pad and of the corresponding connection terminal simply by inspecting the bottom side of the PCB. Moreover, since all the solder pads configured for transmitting high-frequency signals are SMT-based structures, better transmission will be provided to the connector, accordingly.

6 Claims, 11 Drawing Sheets

PCB WITH TWO ROWS OF SOLDER PADS INCLUDING BOTH SMT-BASED AND DIP-BASED STRUCTURES

FIELD OF THE INVENTION

The present invention relates to a printed circuit board structure and more particularly to a printed circuit board with both SMT-based and DIP-based structures, and with all the solder pads for transmitting high-frequency signals configured as SMT-based structures.

BACKGROUND OF THE INVENTION

In the early days, the dual in-line package (DIP) method was typically used to solder electronic devices such as connectors to printed circuit boards (PCBs), as briefly described below. To begin with, a PCB is formed with a plurality of plated through holes (PTHs), and the leads of an electronic device are inserted through the corresponding PTHs respectively and hence exposed on the bottom side of the PCB. The bottom side of the PCB is then coated with an appropriate amount of flux to remove the oxidized film on the metal surfaces of the pads on the PCB and of the leads, and to also form a protective film on the aforesaid metal surfaces against further oxidation. After that, the PCB is dipped into the molten solder in a preheated soldering machine in order for the solder to attach to the leads of the electronic device and the PTHs, thereby soldering the electronic device to the PCB.

As electronic products were made increasingly thinner and lighter, and the density of electronic devices on a PCB became higher and higher, the surface-mount technology (SMT) was soon developed and put to use. SMT involves printing the top side of a PCB with solder paste at positions where an electronic device is to be soldered, placing the leads of the electronic device at the solder paste-coated positions, and passing the PCB along with the electronic device through a reflow oven to melt the solder paste and thus solder the electronic device to the PCB. Since SMT does not require forming through holes in a PCB, not only can the PCB be downsized, but also the circuit layout on the PCB can be planned with higher flexibility.

Figure 1:
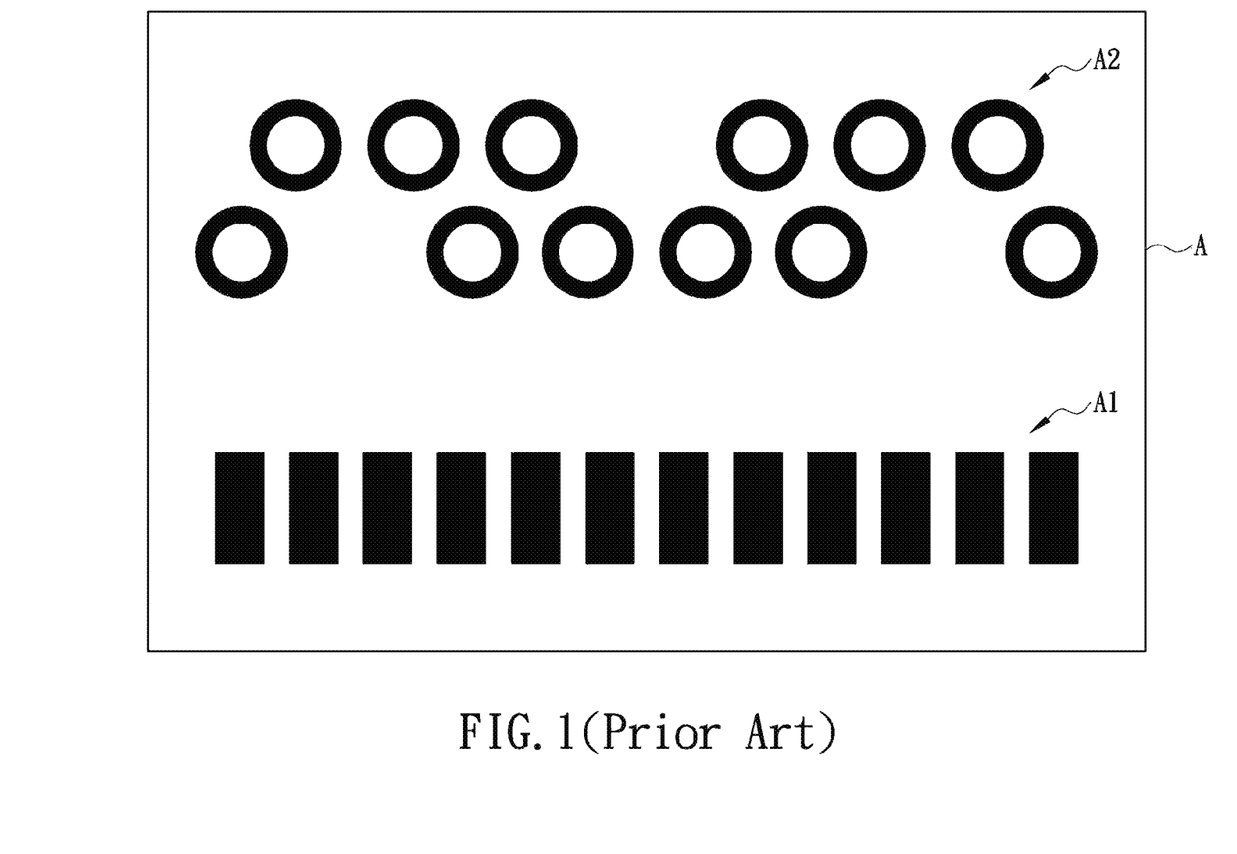
FIG. 1 schematically shows a conventional PCB structure.
Figure 2:
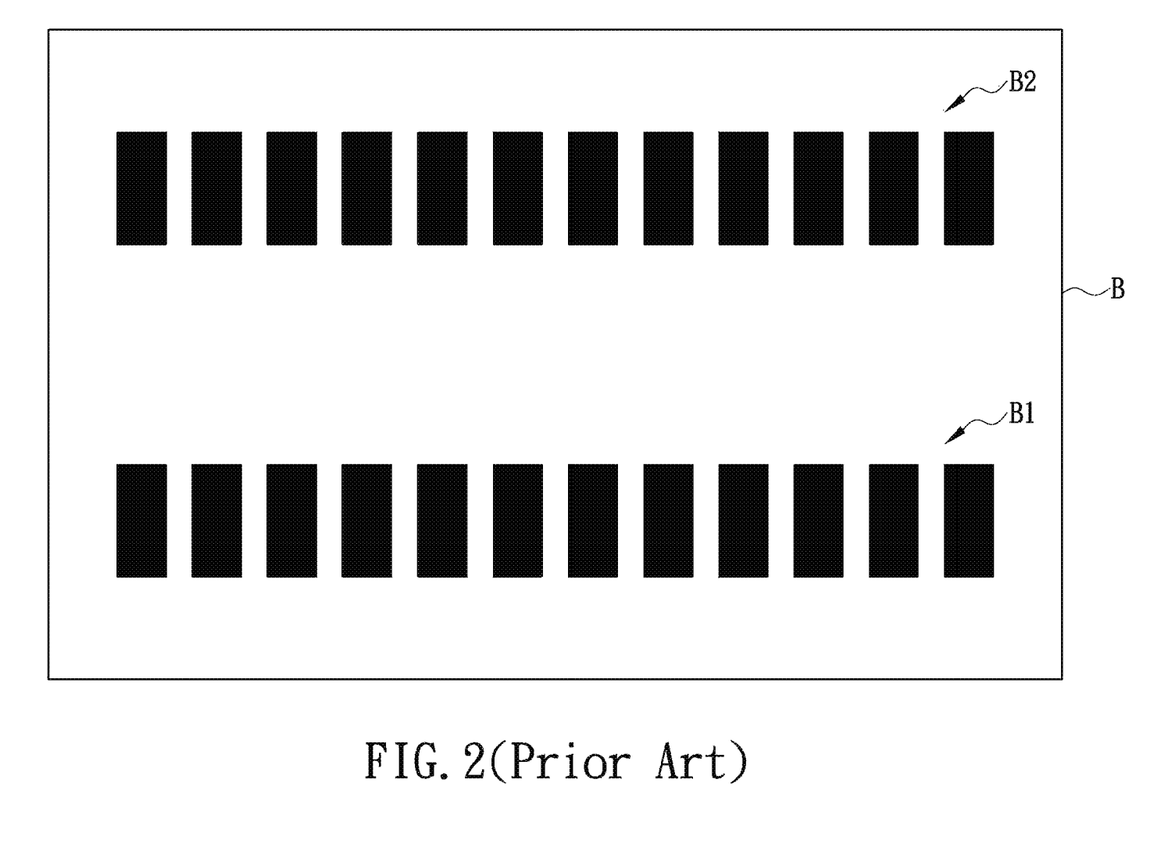
FIG. 2 schematically shows another conventional PCB structure.

In addition, universal serial bus (USB) ports are nowadays almost indispensable features of electronic products when it comes to data transmission and connection with peripherals, and the demand for "high-speed transmission" has led to a comprehensive upgrade of the USB specifications to USB 3.1. In the meantime, "Type-C connectors" were developed to increase the speed of transmission, the types of signals to be transmitted, and the convenience of hot swapping. One major difference of the Type-C connector structure is its "vertically symmetric configuration", which allows a user to insert a Type-C connector freely and intuitively into a corresponding socket without having to identify the vertical orientation of the connector first. In order for a Type-C connector to be used with either side up, however, it is necessary that two identical sets of connection terminals be arranged in each such connector. Generally, a Type-C connector can be soldered to a PCB in two ways. The first way, referring to FIG. 1, is to provide a PCB A with two rows of solder pads A1 and A2, wherein all the solder pads in row A1 are SMT-based structures and all the solder pads in row A2 are DIP-based structures. The second way, referring to FIG. 2, is to provide a PCB B with two rows of solder pads B1 and B2, wherein all the solder pads in rows B1 and B2 are SMT-based structures.

The inventor of the present invention, however, found that both ways leave something to be desired in use. More specifically, referring back to FIG. 1, a Type-C connector soldered to the PCB A in the first way tends to produce undesirable near-end crosstalk (simulated NEXT) when the signal being transmitted has a frequency of 4 GHz or 12 GHz. The second way, though effective in ensuring the transmission speed of a Type-C connector soldered to the PCB B in FIG. 2, requires the two sets of connection terminals of the Type-C connector to be placed sequentially on the PCB B such that, once soldered, the connection terminals on the inner side of the connector (especially those close to the center) will be blocked by the connector itself and therefore difficult to check for soldering defects. The issue to be addressed by the present invention is to improve the structure with which a PCB connects with Type-C connectors.

BRIEF SUMMARY OF THE INVENTION

In view of the aforesaid drawbacks of the conventional PCBs to which USB Type-C connectors can be mounted, the inventor of the present invention incorporated years of practical experience in the industry into extensive research and repeated tests and improvements and finally succeeded in developing a PCB with two rows of solder pads including both SMT-based and DIP-based structures. It is hoped that the invention will give rise to better products that will grab the attention of potential users.

One objective of the present invention is to provide a PCB having two rows of solder pads that include both SMT-based and DIP-based structures. The PCB is configured to be mounted with a USB Type-C connector by soldering, wherein the connector is provided with a first connecting portion and a second connecting portion spaced apart from the first connecting portion, and wherein each of the first connecting portion and the second connecting portion includes a plurality of connection terminals. The PCB includes a substrate, a first row of solder pads, and a second row of solder pads. The first row of solder pads is provided on the top side of the substrate, is adjacent to a lateral edge of the substrate, and includes a plurality of first solder pads, each configured to be soldered to a corresponding one of the connection terminals of the first connecting portion. In the first row of solder pads, all the first solder pads that are used to transmit high-frequency signals are SMT-based structures. The second row of solder pads is also provided on the top side of the substrate, is adjacent to the first row of solder pads, and includes a plurality of second solder pads, each configured to be soldered to a corresponding one of the connection terminals of the second connecting portion. At least one of the second solder pads is a DIP-based structure while the rest of the second solder pads are SMT-based structures. Moreover, in the second row of solder pads, all the second solder pads that are used to transmit high-frequency signals are SMT-based structures. Once the connector is mounted to the PCB, the assembler or an inspector can directly inspect the bottom side of the PCB in order to know how the DIP-based-structure second solder pad is soldered to the corresponding connection terminal. Furthermore, with all the solder pads for high-frequency signal transmission configured as SMT-based structures, the PCB can provide better transmission than its prior art counterpart, allowing the connector to achieve more stable and superior transmission than when mounted on a conventional PCB.

BRIEF DESCRIPTION OF THE SEVERAL VIEWS OF THE DRAWINGS

The objectives, technical features, and effects of the present invention can be better understood by referring to the following detailed description of some illustrative embodiments in conjunction with the accompanying drawings, in which.

DETAILED DESCRIPTION OF THE INVENTION

Figure 3:
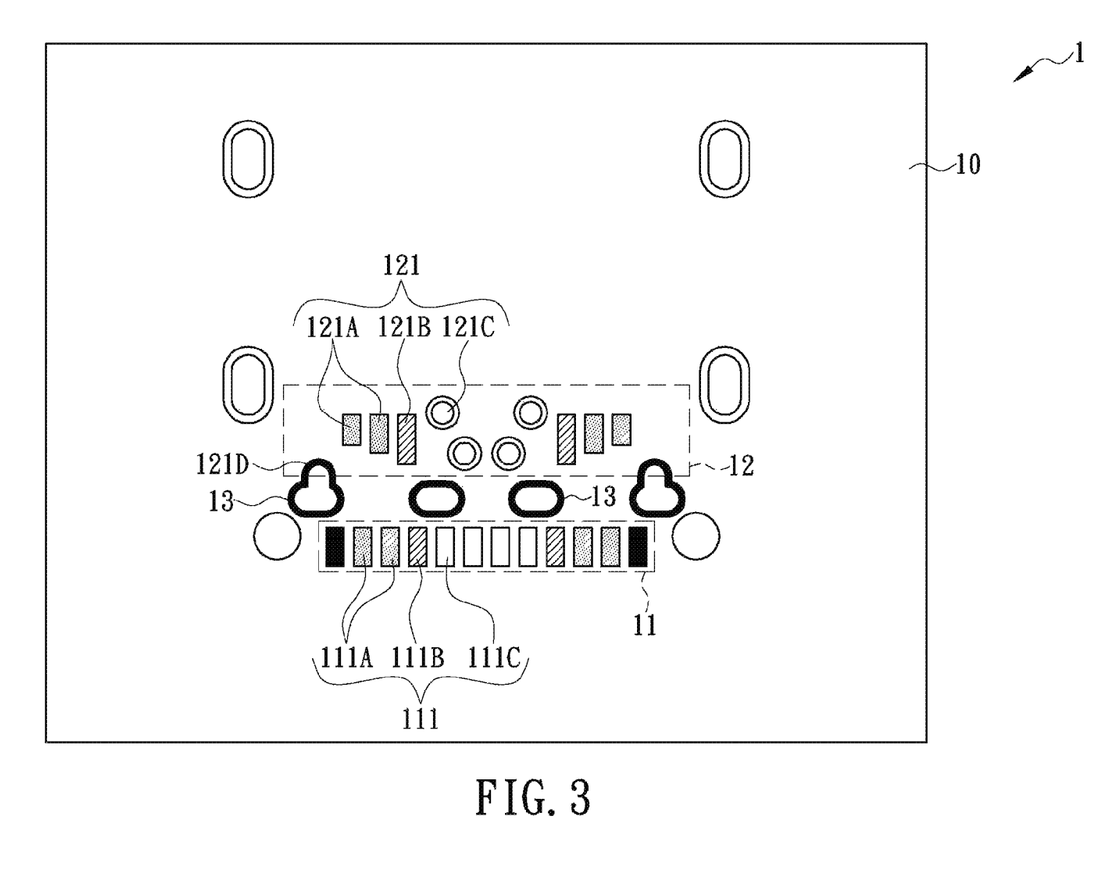
FIG. 3 schematically shows the PCB in an embodiment of the present invention.
Figure 4:
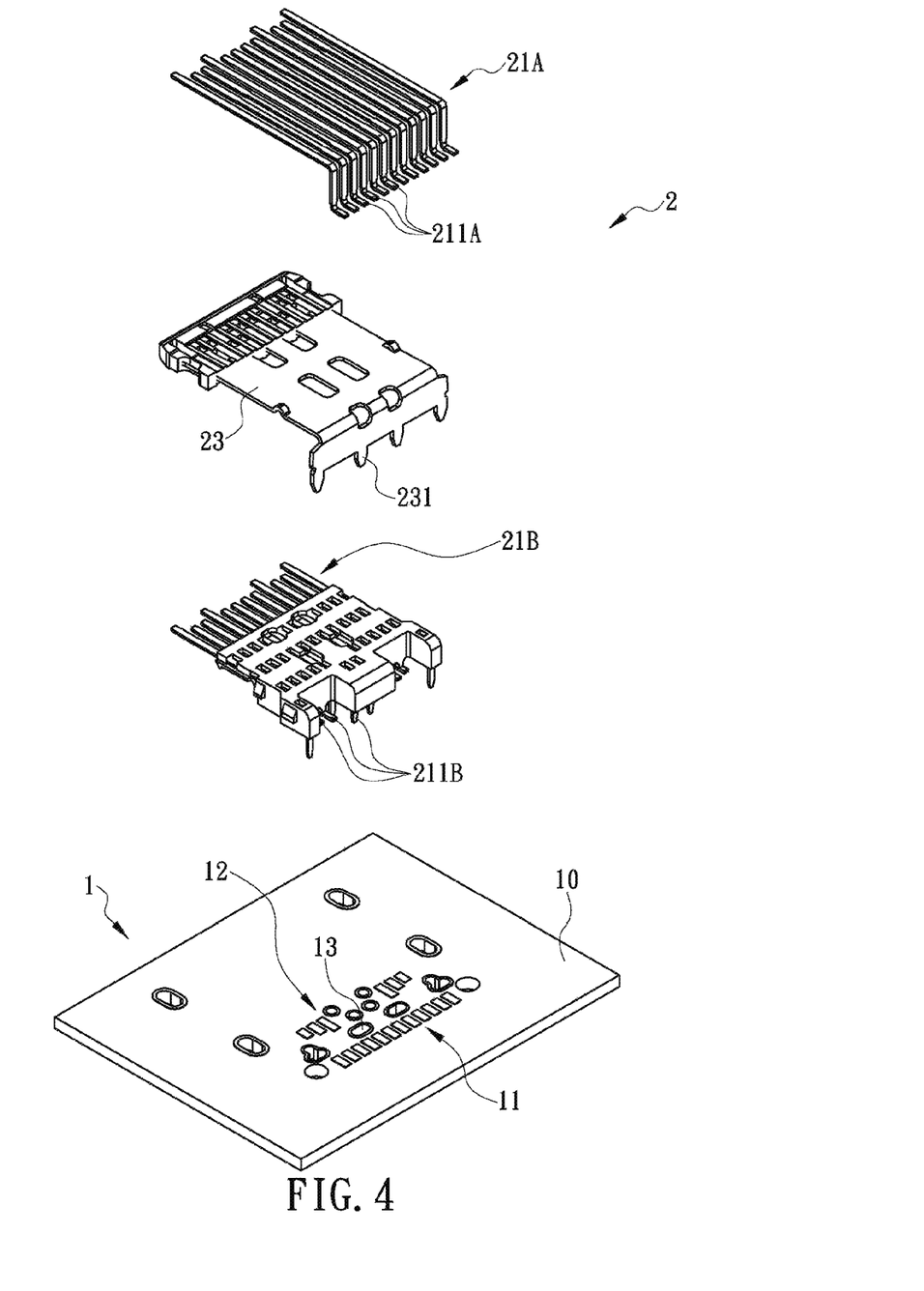
FIG. 4 is an exploded perspective view of the PCB in FIG. 3 and a connector to be mounted to the PCB.
Figure 5:
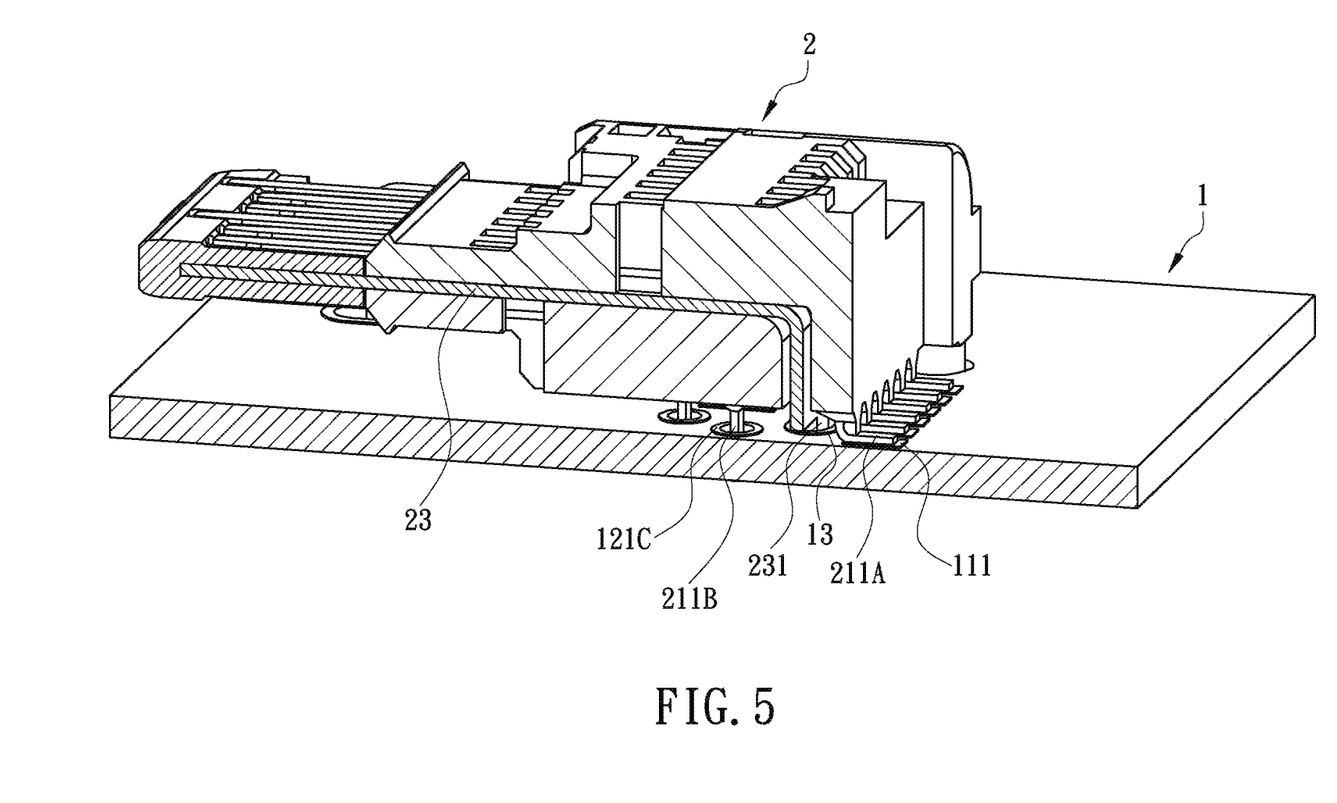
FIG. 5 is an assembled sectional view of the PCB and the connector in FIG. 4.

The present invention provides a printed circuit board (PCB) having two rows of solder pads including both surface-mount technology (SMT)-based and dual in-line package (DIP)-based structures. In one embodiment as shown in FIGS. 3-5, the PCB 1 is configured to be mounted with a USB Type-C connector 2 by soldering. The connector 2 is provided with a first connecting portion 21A and a second connecting portion 21B. The connecting portions 21A and 21B are spaced apart and include a plurality of connection terminals 211A and a plurality of connection terminals 211B respectively. Each connection terminal 211A or 211B has one end extending to the front end of the connector 2 (the forward direction of the connector being defined in FIG. 5 as the direction to the left of the drawing) and an opposite end (hereinafter referred to as the second end) that is bent and extends to a bottom portion of the connector 2. In this embodiment, the connection terminals 211A of the first connecting portion 21A lie above the connection terminals 211B of the second connecting portion 21B, the second ends of the connection terminals 211A of the first connecting portion 21A are adjacent to the rear end of the connector 2 (the rearward direction of the connector being defined in FIG. 5 as the direction to the right of the drawing), and the second ends of the connection terminals 211B of the second connecting portion 21B are closer to the front end of the connector 2 than the second ends of the connection terminals 211A of the first connecting portion 21A.

With continued reference to FIG. 3-5, the PCB 1 includes a substrate 10, a first row 11 of solder pads, and a second row 12 of solder pads. The substrate 10 is made of an insulating material, with a metal circuit laid out on the top side of the substrate 10. To avoid complicating the drawings, however, the metal circuit is not shown in FIGS. 3-5. The first row 11 of solder pads is provided on the top side of the substrate 10, is adjacent to a lateral edge of the substrate 10, and includes a plurality of first solder pads 111. When the connector 2 is mounted on the PCB 1, the aforesaid lateral edge of the substrate 10 is adjacent to the rear end of the connector 2; in other words, the first connecting portion 21A corresponds to the first row 11 of solder pads. Moreover, each connection terminal 211A of the first connecting portion 21A corresponds to one of the first solder pads 111. The second row 12 of solder pads is also provided on the top side of the substrate 10, is adjacent to but spaced apart from the first row 11 of solder pads, and includes a plurality of second solder pads 121. When the connector 2 is mounted on the PCB 1, the second connecting portion 21B of the connector 2 corresponds to the second row 12 of solder pads, with each connection terminal 211B of the second connecting portion 21B corresponding to one of the second solder pads 121.

Referring again to FIGS. 3-5, it should be pointed out that the connection terminals 211A and 211B of the USB Type-C connector 2 can be generally divided into three types. The first type of connection terminals are those for "transmitting high-frequency signals"; the second type, for "transmitting current signals"; and the third type, for "transmitting common signals (i.e., signals other than high-frequency signals and current signals)". When the connector 2 is mounted on the PCB 1, the first and second solder pads 111 and 121 that correspond to the first type of connection terminals are solder pads for transmitting high-frequency signals (hence also referred to herein as high-frequency solder pads 111A and 121A respectively, indicated in FIG. 3 by the dotted areas), the first and second solder pads 111 and 121 that correspond to the second type of connection terminals are solder pads for transmitting current signals (hence also referred to herein as current solder pads 111B and 121B respectively, indicated in FIG. 3 by the hatched areas), and the first and second solder pads 111 and 121 that correspond to the third type of connection terminals are solder pads for transmitting common signals (hence also referred to herein as common solder pads 111C and 121C respectively, indicated in FIG. 3 by the blank areas).

As shown in FIGS. 3-5, at least one of the second solder pads 121 in the second row 12 of solder pads 121 is a DIP-based structure (i.e., designed as a through hole, as indicated by the reference numeral 121C in FIG. 3) while the remaining second solder pads 121 are SMT-based structures (i.e., designed as flat contacts, as indicated by the reference numerals 121A and 121B in FIG. 3). Given that an SMT-based structure features a lower loss than a DIP-based structure during signal transmission, the second solder pads 121 on the PCB 1 that are used to transmit high-frequency signals (i.e., the high-frequency solder pads 121A) must be SMT-based structures. The second solder pads 121 for transmitting current signals (i.e., the current solder pads 121B) may also be SMT-based structures, as demonstrated in this embodiment. As for the other second solder pads 121 (i.e., the common solder pads 121C), DIP-based structures apply. Therefore, once the connector 2 is mounted to the PCB 1, an inspector can easily check the soldering quality of the DIP-based-structure second solder pads 121 by inspecting the bottom side of the substrate 10, despite the fact that the second solder pads 121 lie on the inner side of the connector 2 and are hence blocked by the connector 2. In addition, as the second solder pads 121 vary in structure (e.g., the high-frequency solder pads 121A versus the common solder pads 121C), so do the second ends of the connection terminals 211B soldered respectively to the various second solder pads 121 (see FIG. 5).

Like the second solder pads 121 in the second row 12 of solder pads, with continued reference to FIGS. 3-5, the first solder pads 111 in the first row 11 of solder pads may include SMT-based structures for transmitting high-frequency signals (i.e., the high-frequency solder pads 111A) while the remaining first solder pads 111 are configured as DIP-based structures. Alternatively, all the first solder pads 111 may be SMT-based structures, as demonstrated by the embodiment shown in FIG. 3. After all, the first solder pads 111 and the connection terminals 211A of the first connecting portion 21A are adjacent to the rear end of the connector 2 (see FIG. 5), are not hidden from view, and therefore can be visually inspected for soldering defects with great ease. Since all the first and second solder pads 111 and 121 for transmitting high-frequency signals are SMT-based structures, the PCB 1 can provide better transmission than its prior art counterparts, and the combination of the connector 2 and the PCB 1 ensures more stable and superior transmission than conventionally achievable.

Figure 6A:
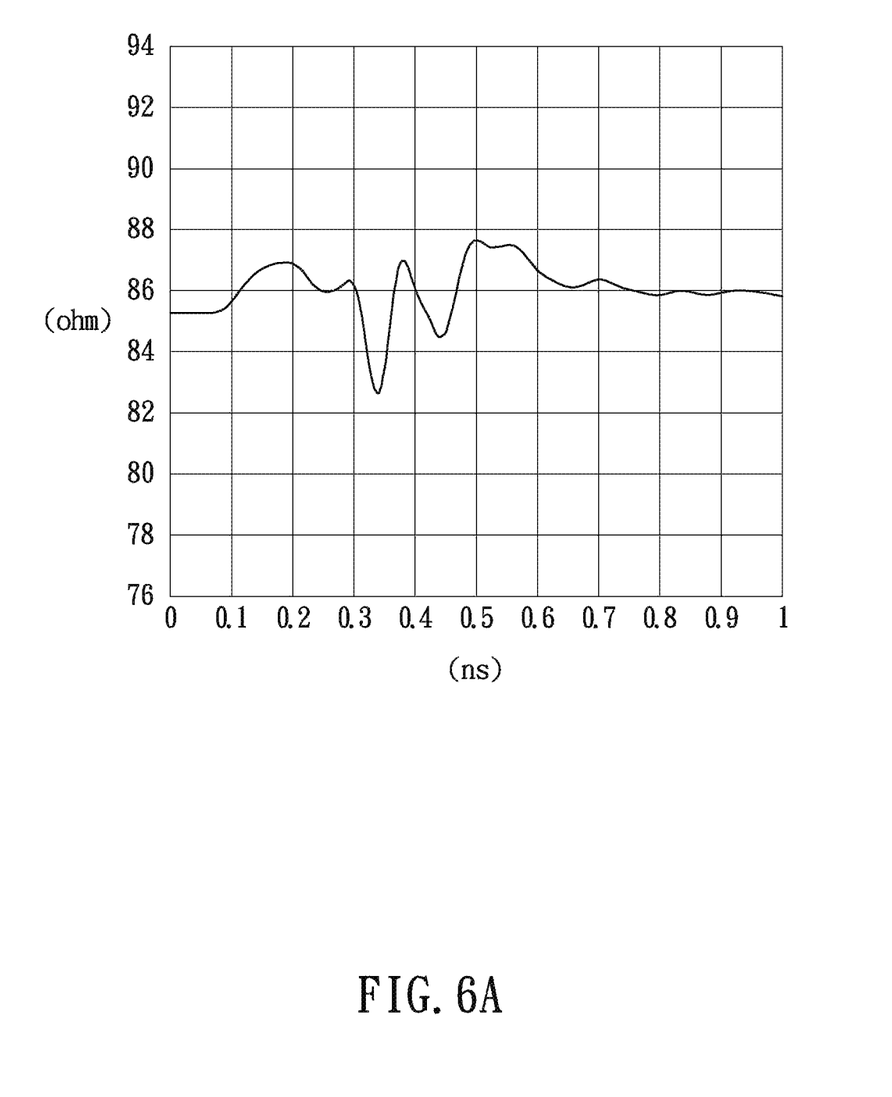
FIG. 6A shows the test results of simulated characteristic impedance of the connector in FIG. 4 when the connector is mounted on the PCB of the present invention.
Figure 6B:
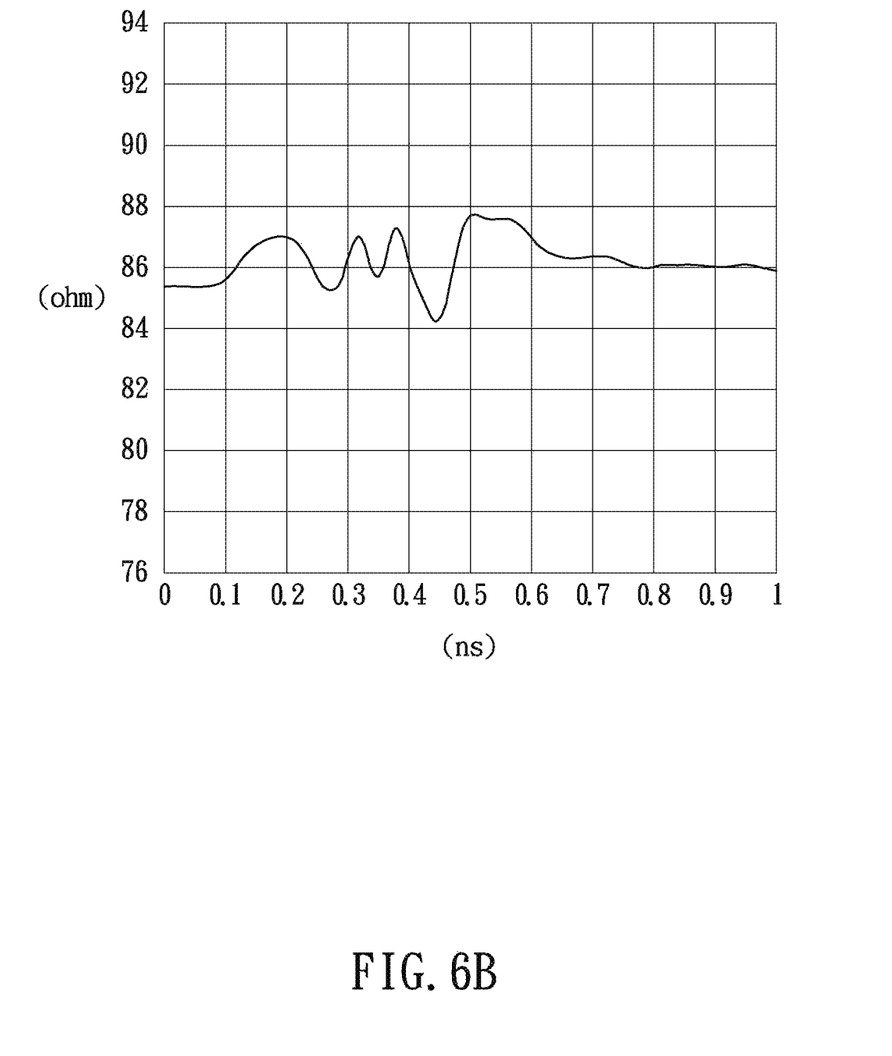
FIG. 6B shows the test results of simulated characteristic impedance of the connector in FIG. 4 when the connector is mounted on the PCB in FIG. 2.
Figure 6C:
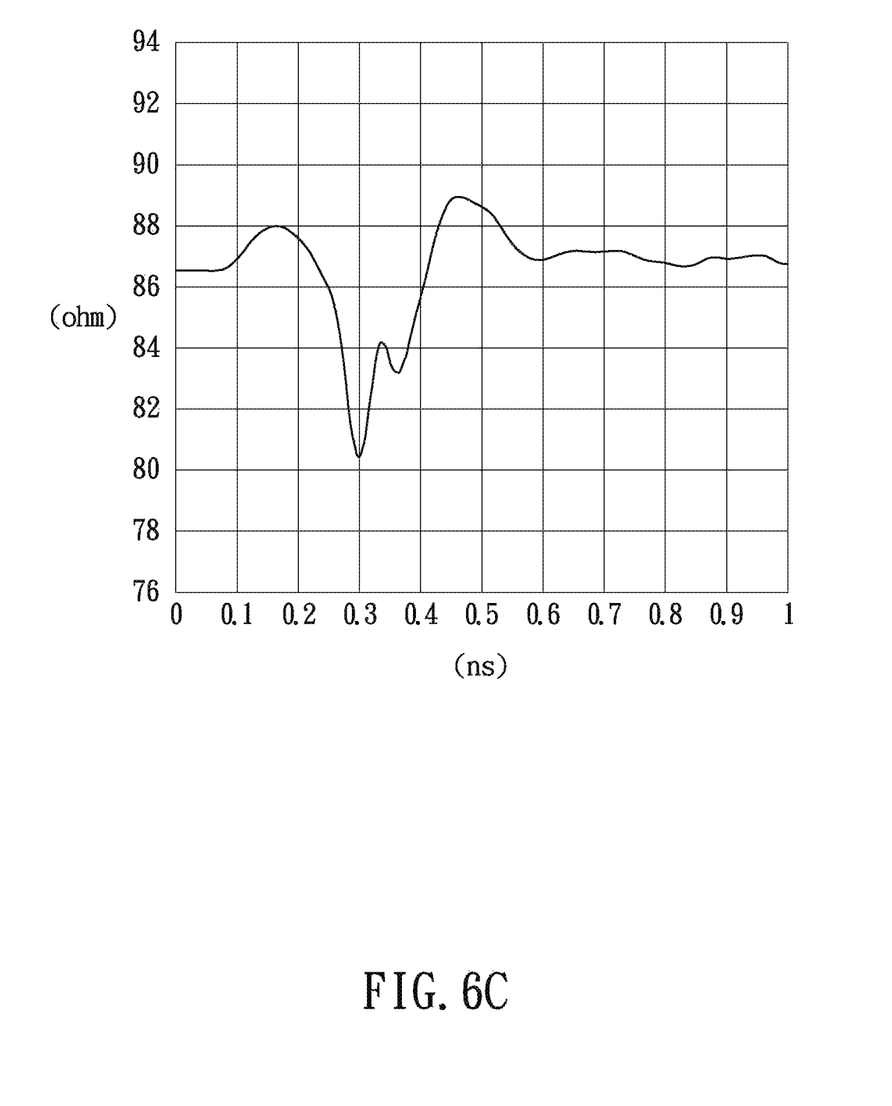
FIG. 6C shows the test results of simulated characteristic impedance of the connector in FIG. 4 when the connector is mounted on the PCB in FIG. 1.

Please refer now to FIGS. 6A-6C, in which FIG. 6A shows the test results of simulated characteristic impedance of the USB Type-C connector 2 when the connector 2 is soldered on the PCB 1 of the present invention (see FIG. 3), FIG. 6B shows the test results of simulated characteristic impedance of the USB Type-C connector 2 when the connector 2 is soldered on the PCB B in FIG. 2, and FIG. 6C shows the test results of simulated characteristic impedance of the USB Type-C connector 2 when the connector 2 is soldered on the PCB A in FIG. 1. Generally speaking, the more level (i.e., the less bumpy) the curve representing the simulated characteristic impedance values, the more desirable the performance of the connector in signal transmission. As can be clearly seen in FIGS. 6A-6C, the test results of simulated characteristic impedance corresponding to the PCB 1 of the present invention are similar to those corresponding to the PCB B (whose two rows of solder pads B1 and B2 are all SMT-based structures) and are better than those corresponding to the PCB A (with one row of solder pads, i.e., A1, all configured as SMT-based structures and the other row of solder pads, i.e., A2, all configured DIP-based structures).

Figure 7A:
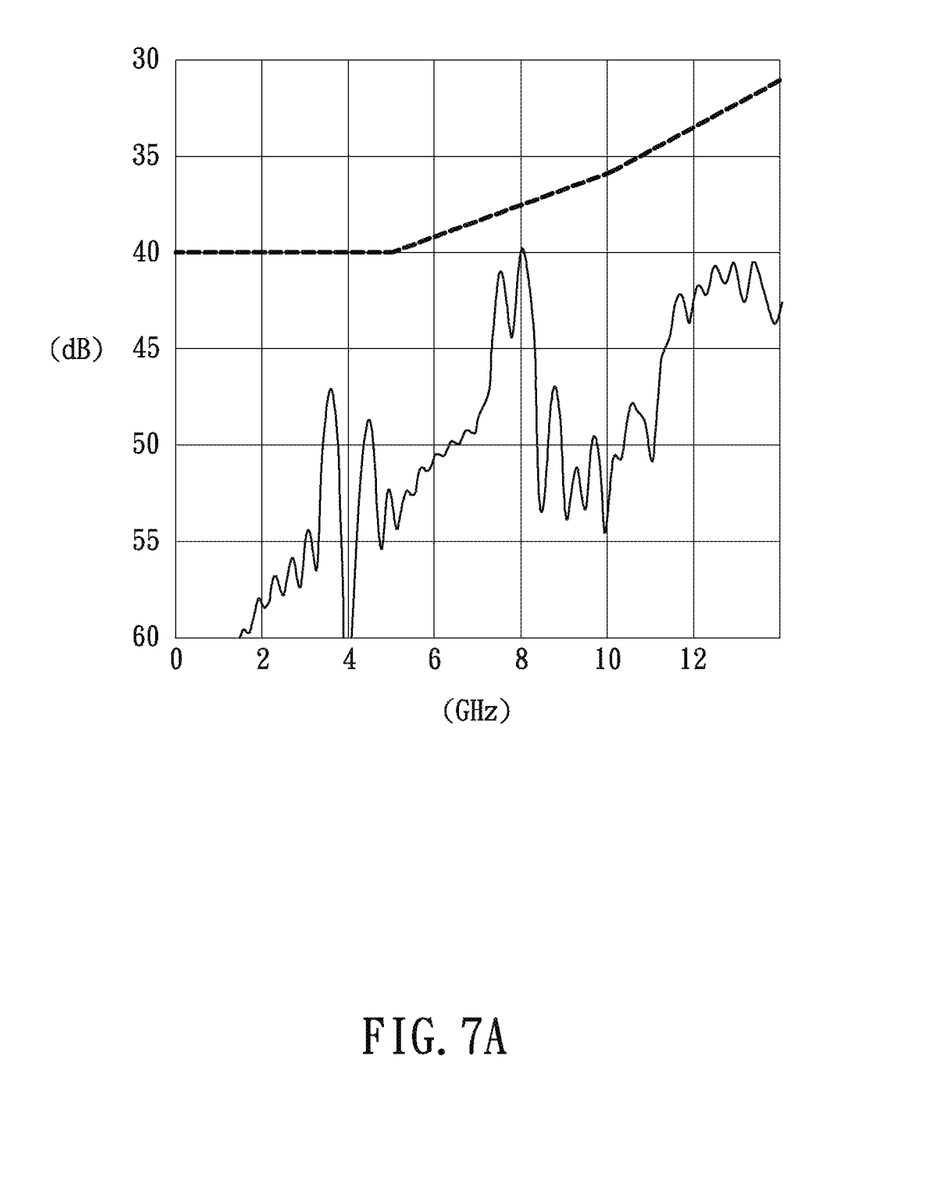
FIG. 7A shows the test results of simulated NEXT of the connector in FIG. 4 when the connector is mounted on the PCB of the present invention.
Figure 7B:
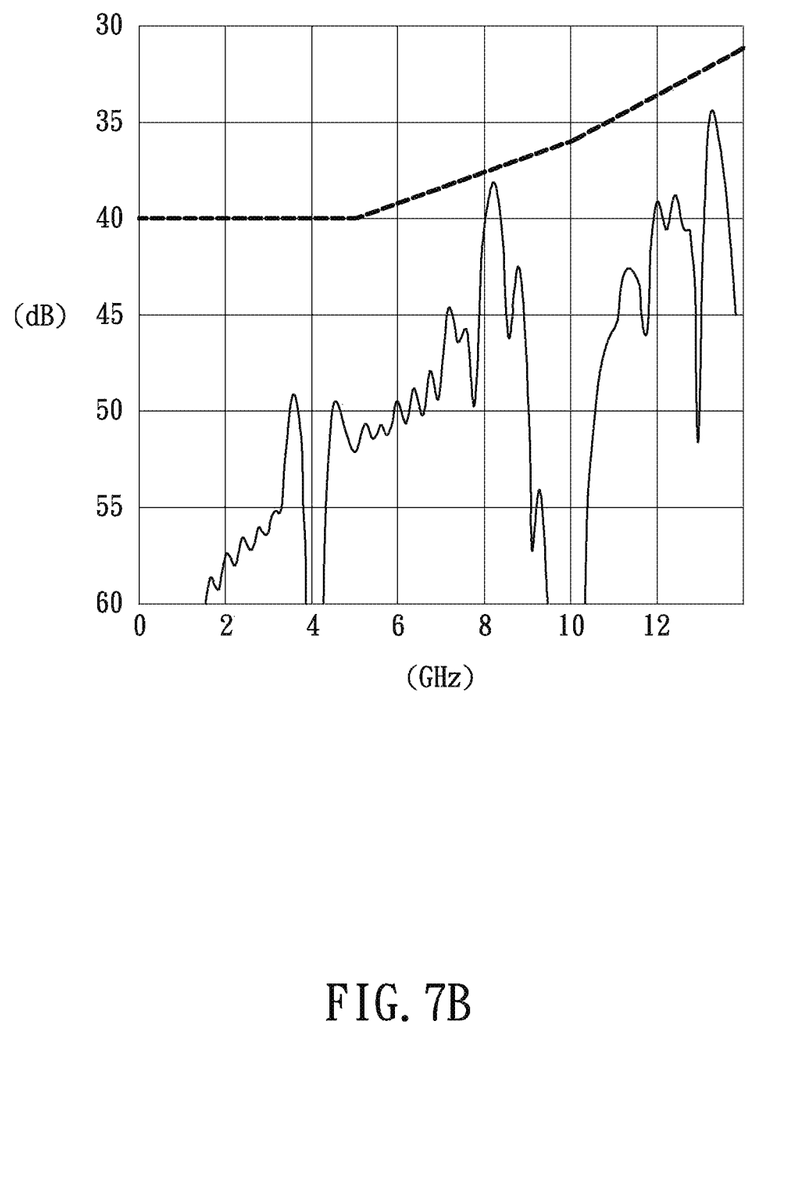
FIG. 7B shows the test results of simulated NEXT of the connector in FIG. 4 when the connector is mounted on the PCB in FIG. 2.
Figure 7C:
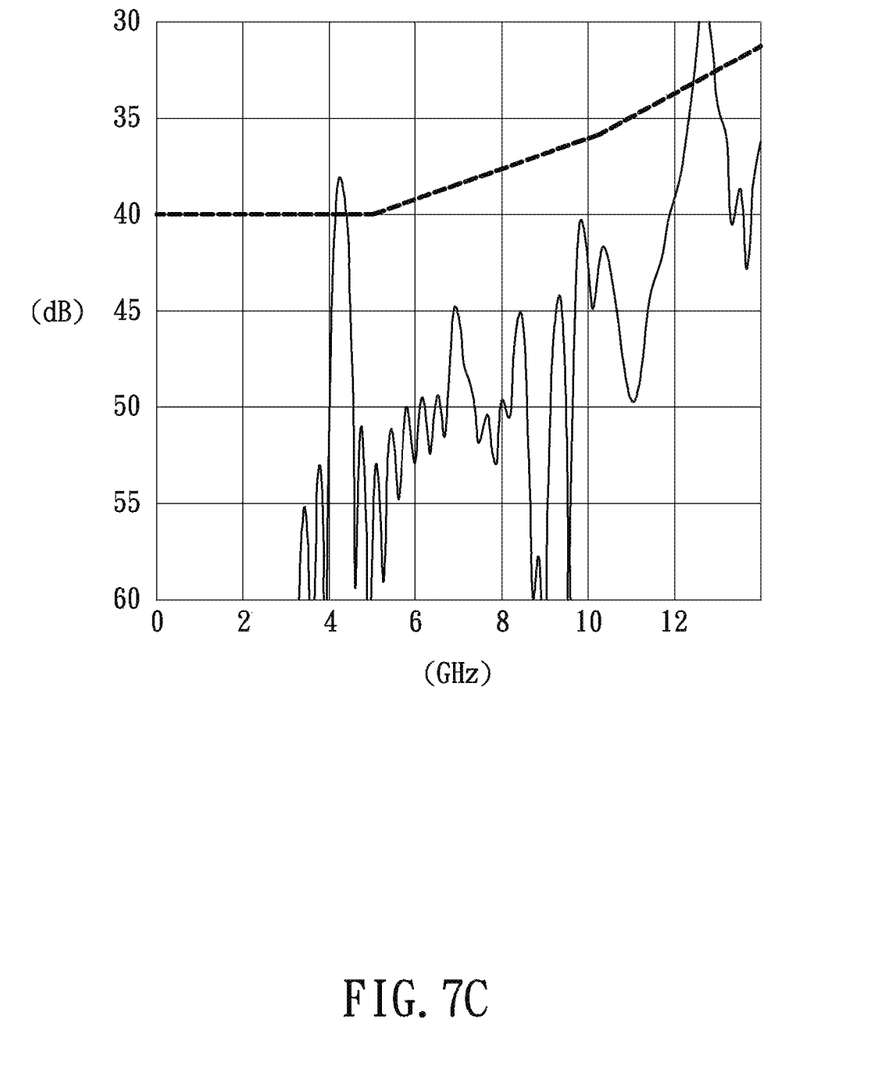
FIG. 7C shows the test results of simulated NEXT of the connector in FIG. 4 when the connector is mounted on the PCB in FIG. 1.

Refer now to FIGS. 7A-7C, in which FIG. 7A shows the test results of simulated NEXT of the USB Type-C connector 2 when the connector 2 is soldered on the PCB 1 of the present invention (see FIG. 3), FIG. 7B shows the test results of simulated NEXT of the USB Type-C connector 2 when the connector 2 is soldered on the PCB B in FIG. 2, and FIG. 7C shows the test results of simulated NEXT of the USB Type-C connector 2 when the connector 2 is soldered on the PCB A in FIG. 1. Generally speaking, where the curve representing the simulated NEXT values exceeds the standard value (e.g., the dashed lines in FIGS. 7A-7C), the connector 2 performs poorly in transmitting a signal of the corresponding frequency. As can be clearly seen in FIGS. 7A-7C, the test results of simulated NEXT corresponding to the PCB 1 and to the PCB B do not exceed the standard value and are better than those corresponding to the PCB A (as shown in FIG. 7C, the PCB A performed unsatisfactorily around 40 GHz and 12 GHz).

According to the above, referring back to FIGS. 3-5, the PCB 1 of the present invention is so designed that the transmission effect of the connector 2 mounted thereon is almost identical to that achievable when the connector 2 is mounted on a PCB whose solder pads are all configured as SMT-based structures. Besides, the present invention allows an assembler or inspector to check the soldering quality of the DIP-based-structure second solder pads 121 by inspecting the bottom side of the PCB 1; that is to say, the difficulty of inspecting the common solder pads 121C, which are located in the central region of the second row 12 of solder pads and consequently blocked by the connector 2, is overcome. After all, the gap formed between the bottom portion of the connector 2 and the top side of the PCB 1 by mounting the connector 2 to the PCB 1 is so limited that an inspector or assembler will have problem checking the soldering quality of the common solder pads 121C and the corresponding connection terminals 211B through the gap.

To increase the accuracy of inspection of soldering quality, referring again to FIGS. 3-5, the SMT-based-structure second solder pads 121 (e.g., the high-frequency solder pads 121A and the current solder pads 121B) in the second row 12 of solder pads in this embodiment have gradually increasing overall lengths, starting from a peripheral area of the PCB 1 toward the center of the PCB 1, as shown in FIG. 3. That is to say, the leftmost high-frequency solder pad 121A is shorter than the neighboring high-frequency solder pad 121A, which in turn is shorter than the adjacent current solder pad 121B. The variation of length makes it easier for an inspector or assembler to inspect the soldering quality of the second solder pads 121 and of the corresponding connection terminals 211B through the gap between the bottom portion of the connector 2 and the top side of the PCB 1. Furthermore, with a view to enhancing high-frequency signal transmission through the connector 2, a plurality of grounding portions 13 are provided between the first row 11 of solder pads and the second row 12 of solder pads. The grounding portions 13 are DIP-based structures configured to be soldered to the grounding terminals 231 of the connector 2 respectively. The grounding terminals 231 are provided on a grounding plate 23 of the connector 2, and the grounding plate 23 lies between the connecting portions 21A and 21B to reduce interference between the connecting portions 21A and 21B during transmission of high-frequency signals. In other embodiments of the present invention, the grounding portions 13 may be SMT-based structures instead. Moreover, the two outermost second solder pads 121 in the second row 12 of solder pads are configured for grounding and hence also referred to herein as grounding solder pads 121D. The grounding solder pads 121D may be DIP-based structures, each in communication with the corresponding grounding portion 13 and solderable to the corresponding connection terminal 211B in the second connecting portion 21B that is configured for grounding. The foregoing structural arrangement ensures a good grounding effect and can effectively reduce the noise generated during operation of the connector 2. In another embodiment of the present invention where the grounding solder pads 121D are SMT-based structures, the lengths of the grounding solder pads 121D may be smaller than those of the adjacent high-frequency solder pads 121A.

While the invention herein disclosed has been described by means of specific embodiments, numerous modifications and variations could be made thereto by those skilled in the art without departing from the scope of the invention set forth in the claims.

What is claimed is:

1. A printed circuit board (PCB) with two rows of solder pads including both surface-mount technology (SMT)-based and dual in-line package (DIP)-based structures, wherein the PCB is configured to be mounted with a USB Type-C connector by soldering, the connector is provided with a first connecting portion and a second connecting portion spaced apart from the first connecting portion, and each of the first connecting portion and the second connecting portion includes a plurality of connection terminals, the PCB comprising:

a substrate made of an insulating material;

a first row of solder pads provided on a top side, and adjacent to a lateral edge, of the substrate and comprising a plurality of first solder pads, each configured to be soldered to a corresponding one of the connection terminals of the first connecting portion, wherein said first solder pads in the first row of solder pads that are used to transmit high-frequency signals are SMT-based structures; and a second row of solder pads provided on the top side of the substrate, adjacent to the first row of solder pads, and comprising a plurality of second solder pads, each configured to be soldered to a corresponding one of the connection terminals of the second connecting portion, wherein at least one of the second solder pads is a DIP-based structure, the remaining second solder pads are SMT-based structures, and said second solder pads in the second row of solder pads that are used to transmit high-frequency signals are SMT-based structures.

2. The PCB of claim 1, wherein said second solder pads in the second row of solder pads that are used to transmit current signals are SMT-based structures.

3. The PCB of claim 2, wherein said second solder pads in the second row of solder pads that are SMT-based structures increase in overall length sequentially from a peripheral area of the PCB toward a center of the PCB.

4. The PCB of claim 3, wherein the first solder pads in the first row of solder pads are all SMT-based structures.

5. The PCB of claim 4, wherein the first row of solder pads and the second row of solder pads are spaced apart, with a plurality of grounding portions provided therebetween, the grounding portions being DIP-based structures respectively solderable to grounding terminals of a grounding plate of the connector.

6. The PCB of claim 5, wherein two outermost said second solder pads in the second row of solder pads that are used for grounding are DIP-based structures and are in communication with corresponding ones of the grounding portions respectively, and each said second solder pad used for grounding is solderable to a corresponding one of the connection terminals of the second connecting portion that are used for grounding.

* * * * *